(12) United States Patent
Yamada et al.

(10) Patent No.: US 10,580,903 B2
(45) Date of Patent: Mar. 3, 2020

(54) SEMICONDUCTOR-ON-INSULATOR TRANSISTOR WITH IMPROVED BREAKDOWN CHARACTERISTICS

(71) Applicant: pSemi Corporation, San Diego, CA (US)

(72) Inventors: Hiroshi Yamada, San Diego, CA (US); Abhijeet Paul, Poway, CA (US); Alain Duvallet, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/920,321

(22) Filed: Mar. 13, 2018

(65) Prior Publication Data

US 2019/0288119 A1    Sep. 19, 2019

(51) Int. Cl.
*H01L 21/84*    (2006.01)
*H01L 29/66*    (2006.01)
(Continued)

(52) U.S. Cl.
CPC ........ *H01L 29/78648* (2013.01); *H01L 21/84* (2013.01); *H01L 27/1203* (2013.01);
(Continued)

(58) Field of Classification Search
CPC ......... H01L 29/78648; H01L 29/66484; H01L 29/66742
(Continued)

(56) References Cited

U.S. PATENT DOCUMENTS 5,633,182 A    5/1997  Miyawaki et al.
6,365,465 B1 *  4/2002  Chan ................. H01L 21/76251
                                                257/E21.415
(Continued)

FOREIGN PATENT DOCUMENTS

EP    1453093    9/2004
EP    2814053    12/2014
(Continued)

OTHER PUBLICATIONS

Englekirk, et al., "Managed Substrate Effects for Stabilized SOI FETS", U.S. Patent Application filed in the USPTO on May 19, 2017, U.S. Appl. No. 15/600,588, 62 pgs.
(Continued)

*Primary Examiner* — Didarul A Mazumder
(74) *Attorney, Agent, or Firm* — Jaquez Land Greenhaus LLP; John Land, Esq.

(57) ABSTRACT

Semiconductor-on-insulator field effect transistor (FET) integrated circuit (IC) structures and fabrication processes that mitigate or eliminate the problems caused by the secondary parasitic back-channel FET of conventional semiconductor-on-insulator FET IC structures. Embodiments enable full control of the secondary parasitic back-channel FET of semiconductor-on-insulator IC primary FETs. Embodiments include taking partially fabricated ICs made using a process which allows access to the back side of the FET, such as "single layer transfer" process, and then fabricating a conductive aligned supplemental (CAS) gate structure relative to the insulating layer juxtaposed to a primary FET such that a control voltage applied to the CAS gate can regulate the electrical characteristics of the regions of the primary FET adjacent the insulating layer. The IC structures present as a four or five terminal device: source S,
(Continued)

drain D, primary gate G, CAS gate, and, optionally, a body contact.

18 Claims, 17 Drawing Sheets

(51) Int. Cl.
  *H01L 27/12* (2006.01)
  *H01L 29/78* (2006.01)
  *H01L 29/786* (2006.01)

(52) U.S. Cl.
  CPC .. *H01L 29/66484* (2013.01); *H01L 29/66742* (2013.01); *H01L 29/66772* (2013.01)

(58) Field of Classification Search
  USPC .......................... 257/347; 438/149, 479, 517
  See application file for complete search history.

(56) References Cited

U.S. PATENT DOCUMENTS

| | | | |
|---|---|---|---|
| 6,580,132 B1* | 6/2003 | Chan | H01L 29/4908 257/347 |
| 7,180,019 B1 | 2/2007 | Chiou et al. | |
| 9,530,798 B1 | 12/2016 | Chou et al. | |
| 9,755,029 B1 | 9/2017 | Goktepeli | |
| 9,780,210 B1 | 10/2017 | Goktepeli et al. | |
| 9,837,412 B2 | 12/2017 | Tasbas et al. | |
| 9,960,098 B2 | 5/2018 | Olson | |
| 2005/0037582 A1* | 2/2005 | Dennard | H01L 21/76256 438/281 |
| 2005/0242884 A1 | 11/2005 | Anand | |
| 2006/0006496 A1 | 1/2006 | Harris et al. | |
| 2006/0012006 A1 | 1/2006 | Tung et al. | |
| 2008/0020488 A1 | 1/2008 | Clevenger et al. | |
| 2008/0079037 A1 | 4/2008 | Zhu et al. | |
| 2008/0277778 A1 | 11/2008 | Furman et al. | |
| 2009/0010056 A1* | 1/2009 | Kuo | G11C 16/0408 365/184 |
| 2010/0155932 A1 | 6/2010 | Gambino et al. | |
| 2012/0146193 A1 | 6/2012 | Stuber et al. | |
| 2012/0193752 A1 | 8/2012 | Purushothaman et al. | |
| 2013/0037922 A1 | 2/2013 | Arriagada et al. | |
| 2013/0270678 A1 | 10/2013 | Rankin et al. | |
| 2014/0191322 A1 | 7/2014 | Botula et al. | |
| 2014/0264468 A1* | 9/2014 | Cheng | G01N 27/4145 257/253 |
| 2014/0342529 A1 | 11/2014 | Goktepeli et al. | |
| 2015/0255368 A1 | 9/2015 | Costa | |
| 2016/0027665 A1 | 1/2016 | Li et al. | |
| 2016/0141228 A1 | 5/2016 | Leobandung | |
| 2016/0336344 A1* | 11/2016 | Mason | H01L 27/1203 |
| 2016/0336990 A1 | 11/2016 | Petzold et al. | |
| 2016/0379943 A1 | 12/2016 | Mason et al. | |
| 2017/0033135 A1 | 2/2017 | Whitefield et al. | |
| 2017/0084531 A1 | 3/2017 | Gu et al. | |
| 2017/0201291 A1 | 7/2017 | Gu et al. | |
| 2017/0373026 A1 | 12/2017 | Goktepeli | |
| 2018/0025970 A1 | 1/2018 | Kao et al. | |
| 2018/0151487 A1 | 5/2018 | Venugopal et al. | |
| 2018/0158405 A1 | 6/2018 | Agostinelli et al. | |
| 2018/0240797 A1 | 8/2018 | Yokoyama et al. | |
| 2019/0288006 A1 | 9/2019 | Paul et al. | |

FOREIGN PATENT DOCUMENTS

| | | |
|---|---|---|
| EP | 2996143 | 3/2016 |
| EP | 3203507 | 8/2017 |
| JP | 2017174846 | 9/2017 |
| WO | 2007120697 | 10/2007 |
| WO | 2011008893 | 1/2011 |
| WO | 2016183146 | 11/2016 |
| WO | 2017038403 | 3/2017 |
| WO | 2019178004 | 9/2019 |

OTHER PUBLICATIONS

Celler, et al., "Frontiers of Silicon-on-Insulator", Journal of Applied Physics, vol. 93, No. 9, May 1, 2003, pp. 4955-4978 (25 pgs).

Le, Thao P., Office Action received from the USPTO dated Mar. 22, 2019 for U.S. Appl. No. 16/040,390, 11 pgs.

Le, Thao P., Office Action received from the USPTO dated Apr. 4, 2019 for U.S. Appl. No. 16/040,411, 6 pgs.

Meierewert, Klaus, Invitation to Pay Additional Fees and, Where Applicable, Protest Fee received from the EPO dated Jun. 28, 2019 for appln. No. PCT/US2019/021698, 13 pgs.

Le, Thao P., Notice of Allowance received from the USPTO dated Jun. 5, 2019 for U.S. Appl. No. 16/040,290, 7 pgs.

Le, Thao P., Office Action received from the USPTO dated Jun. 14, 2019 for U.S. Appl. No. 16/040,411, 5 pgs.

Le, Thao P., Notice of Allowance received from the USPTO dated Aug. 20, 2019 for U.S. Appl. No. 16/040,390, 14 pgs.

Huynh, Andy, Office Action received from the USPTO dated Sep. 9, 2019 for U.S. Appl. No. 16/040,295, 5 pgs.

Le, Thao P., Office Action received from the USPTO dated Sep. 13, 2019 for U.S. Appl. No. 16/040,411, 14 pgs.

Hoffman, Niels, International Search Report and Written Opinion received from the EPO dated Oct. 8, 2019 for appln. No. PCT/US2019/021698, 18 pgs.

Le, Thao P., Notice of Allowance received from the USPTO dated Dec. 28, 1929 for U.S. Appl. No. 16/040,390, 17 pgs.

Abdelaziez, Yasser A., Office Action received from the USPTO dated U.S. Appl. No. 16/243,947, 8 pgs.

Wirner, Christoph, International Search Report received from the USPTO dated Oct. 22, 2019 for appln. No. PCT/US2019/041898, 11 pgs.

Topol, et al. "Enabling SOI-based Assembly Technology for Three-Dimensional (3D) Integrated Circuits (ICs)", International Electron Devices Meeting, 2005.

Wirner, Christoph, International Search Report received from the USPTO dated Oct. 28, 2019 for appln. No. PCT/US2019/042486, 14 pgs.

Wirner, Christoph, International Search Report received from the USPTO dated Oct. 31, 2019 for appln. No. PCT/US2019/043994, 16 pgs.

\* cited by examiner

495

_800_

```
┌─────────────────────────────────────┐
│ Fabricating a partial primary field │
│ effect transistor (FET) on a first  │
│ side of an insulator layer, the     │
│ insulator layer having a second     │
│ side in contact with a substrate,   │── 802
│ the primary FET including a source  │
│ S, a drain D, a gate insulator, a   │
│ gate G, and a superstructure        │
│ formed on a top side of the primary │
│ FET                                 │
└─────────────────────────────────────┘
                  ↓
┌─────────────────────────────────────┐
│ Fabricating a first passivation     │
│ layer on an exposed top surface of  │── 804
│ the superstructure                  │
└─────────────────────────────────────┘
                  ↓
┌─────────────────────────────────────┐
│ Applying a back-side access process │
│ to remove the substrate and expose  │── 806
│ the second side of the insulator    │
│ layer                               │
└─────────────────────────────────────┘
                  ↓
┌─────────────────────────────────────┐
│ Fabricating a second passivation    │
│ layer on an exposed second side of  │── 808
│ the insulator layer                 │
└─────────────────────────────────────┘
                  ↓
┌─────────────────────────────────────┐
│ Removing selected portions of the   │
│ second passivation layer and of the │
│ insulator layer such that remaining │── 810
│ portions of the second passivation  │
│ layer and of the insulator layer    │
│ define a location for the primary   │
│ FET                                 │
└─────────────────────────────────────┘
                  ↓
┌─────────────────────────────────────┐
│ Fabricating a conductive aligned    │
│ supplemental (CAS) gate on the      │
│ second passivation layer and        │
│ aligned with at least a portion of  │── 812
│ the primary FET, such that the      │
│ source S, the drain D, the CAS      │
│ gate, and at least the insulator    │
│ layer function as a field effect    │
│ transistor                          │
└─────────────────────────────────────┘
```

FIG. 8

SEMICONDUCTOR-ON-INSULATOR TRANSISTOR WITH IMPROVED BREAKDOWN CHARACTERISTICS

BACKGROUND

(1) Technical Field

This invention relates to electronic integrated circuits, and more particularly to electronic integrated circuits having transistors fabricated with semiconductor-on-insulator technology.

(2) Background

Virtually all modern electronic products—including laptop computers, mobile telephones, and electric cars—utilize complementary metal oxide semiconductor (CMOS) transistor integrated circuits (ICs), and in many cases CMOS ICs fabricated using a semiconductor-on-insulator process, such as silicon-on-insulator (SOI) or germanium-on-insulator. SOI transistors in which the electrical insulator is aluminum oxide (i.e., sapphire) are called silicon-on-sapphire or "SOS" devices. Another example of a semiconductor-on-insulator technology is "silicon-on-glass", and other examples are known to those of ordinary skill in the art.

Taking SOI as one example of semiconductor-on-insulator, SOI technology encompasses the use of a layered silicon-insulator-silicon substrate in place of conventional "bulk" silicon substrates in semiconductor manufacturing. More specifically, SOI transistors are generally fabricated on a layer of silicon dioxide, SiO2 (often called a "buried oxide" or "BOX" layer), which in turn is formed on a bulk silicon substrate. The BOX layer reduces certain parasitic effects typical of bulk silicon CMOS processes, thereby improving performance. SOI-based devices thus differ from conventional bulk silicon devices in that the silicon regions of the CMOS transistors are fabricated on an electrical insulator (typically silicon dioxide or aluminum oxide) rather than on a bulk silicon substrate.

As a specific example of a semiconductor on insulator process for fabricating ICs, FIG. 1A is a stylized cross-sectional view of a typical prior art SOI IC structure 100 for a single field effect transistor (FET). The SOI structure 100 includes a substrate 102, a buried-oxide (BOX) insulator layer 104, and an active layer 106 (note that the dimensions for the elements of the SOI IC structure 100 are not to scale; some dimensions have been exaggerated for clarity or emphasis). The substrate 102 is typically a semiconductor material such as silicon. The BOX layer 104 is a dielectric, and is often silicon dioxide formed as a "top" surface 102T of the silicon substrate 102, such as by oxidation, layer transfer, or implantation. The active layer 106 may include some combination of implants and/or layers that include dopants, dielectrics, polysilicon, metal wiring, passivation, and other materials to form active and/or passive electronic components and/or mechanical structures. For example, in the illustrated embodiment, a FET (encircled by a dashed oval 108) is shown, with the FET 108 comprising a source S, a drain D, and a primary gate G atop an insulating gate oxide (GOX) layer 110. A body B is defined below the primary gate G, between the source S and the drain D. In operation, a "conduction channel" or an "inversion channel" is generated within the body B between the source S and the drain D and proximate the GOX layer 110 (e.g., within about the top 100A of the body B). A body contact (not shown), which generally comprises a region with the same doping as the body B, may be resistively coupled to the body B through an extension of the semiconductor island typically extending in the width direction of the transistor (in FIG. 1A, that would be in/out of the plane of the image) to provide a fourth terminal to the FET 108. As is known, the body contact is commonly coupled to a bias node such as a power supply, to circuit ground, or to the source S (although other connection nodes are possible). If an SOI transistor has a body contact, it is known as body-contacted transistor, otherwise it is known as a floating-body transistor.

If the source S and drain D are highly doped with N type material, the FET is an N-type FET. Conversely, if the source S and drain D are highly doped with P type material, the FET is a P-type FET. Thus, the source S and drain D doping type determines whether a FET is an N-type or a P-type. CMOS devices comprise N-type and P-type FETs co-fabricated on a single IC die, in known fashion.

A superstructure 112 of various elements, regions, and structures may be fabricated in known fashion above the FET 108 in order to implement particularly functionality. The superstructure 112 may include, for example, conductive interconnections from the illustrated FET 108 to other components (including other FETs) and/or external contacts, passivation layers and regions, and protective coatings. The conductive interconnections may be, for example, copper or other suitable metal or electrically conductive material.

For example, FIG. 1B is a stylized cross-sectional view of a typical prior art SOI IC structure 120 for a single FET, showing details of the superstructure 112. In this example, the superstructure 112 includes conductive (e.g., metal) interconnect levels M1 (closest to the FET 108), M2, M3, M4, and a Top Metal layer, separated in places by insulating and/or passivation layers or regions 116a, 116b. The conductive interconnect levels M1, M2, M3, M4, Top Metal layer, etc., are typically formed within a CMOS fabrication facility. The Top Metal layer may be covered in whole or in part by another conductive material (commonly aluminum) to form what is commonly known as a "redistribution layer", or RDL, shown in FIG. 1B as within a sub-portion 112' of the superstructure 112. Top-side RDLs are generally added after wafers have completed the CMOS fabrication process and are often of much thicker and wider dimensions than the CMOS metallization (e.g., M1, M2, M3, M4, and Top Metal layer). Top-side RDLs are often used to distribute high current power around an IC chip or to render high-Q inductors (and sometimes capacitors) for RF circuits. As can be seen in FIG. 1B, top-side RDLs are often connected to the Top Metal of the IC for subsequent packaging. An aluminum layer may also be used as a capping layer over final copper metal structures, which generally cannot be left exposed in order to avoid oxidation of the copper. Thus, an aluminum layer may be both an RDL and a capping layer.

Other elements, regions, and structures may be included for particular circuit designs. For example, referring to FIG. 1A, conductive substrate contact (S-contacts) (shown as the structure "SC") may be formed from the superstructure 112 through the active layer 106 to the BOX layer 104 or to conductive regions or wells formed in and/or above the BOX layer 104. S-contacts may be used, for example, to mitigate accumulated charge effects that adversely affect the FET, for shielding, and/or for thermal conduction. Examples of applications of S-contacts are set forth in U.S. Pat. No. 9,837,412, issued Dec. 5, 2017, entitled "S-Contact for SOI", in U.S. patent application Ser. No. 15/194,114, filed Jun. 27, 2016, entitled "*Systems and Methods for Thermal Conduction Using S-Contacts*", and in U.S. patent application Ser. No. 15/600,588, filed May 19, 2017, entitled "Managed Substrate Effects for Stabilized SOI FETs", all of which are hereby incorporated by reference.

As should be appreciated by one of ordinary skill in the art, a single IC die may embody from one FET 108 to millions of FETs 108. Further, the various elements of the superstructure 112 may extend in three-dimensions and have quite complex shapes. In general, the details of the superstructure 112 will vary from IC design to IC design.

The BOX layer 104, while enabling many beneficial characteristics for SOI IC's, also introduces some problems, such as capacitive coupling to the substrate 102, a thermal barrier to heat flow, and a voltage breakdown path to the substrate 102. Capacitive coupling with the substrate 102 alone can cause numerous side effects compared to an ideal SOI transistor, such as increased leakage current, lower breakdown voltage, signal cross-coupling, and linearity degradation. However, the most serious capacitive coupling effect caused by the BOX layer 104 is often the "back-channel" effect.

Referring to FIG. 1A, the structure of a secondary parasitic back-channel FET (shown in a dashed square 120) is formed by the source S, the drain D, the BOX layer 104 (functioning as a gate insulator), and the substrate 102 (effectively functioning as a secondary gate). FIG. 1C is an equivalent schematic diagram of the FET structure shown in FIG. 1A, and shows how the secondary parasitic back-channel FET 120 is coupled in parallel with the primary FET 108. Notably, the voltages and charge accumulations in and around the secondary gate (i.e., the substrate 102) may vary and in general are not well controlled. Accordingly, as is widely known, the presence of the secondary parasitic back-channel FET 120 adjacent the FET 108 can place the bottom of the FET 108 in uncontrolled states, often in a subthreshold leakage regime, which in turn may create uncontrollable source-drain leakage currents.

It is possible to mitigate some of the side effects of the secondary parasitic back-channel FET 120. One known mitigating technique utilizes "single layer transfer", or SLT, as part of the IC fabrication process. The SLT process essentially flips an entire SOI transistor structure upside down onto a "handle wafer", with the original substrate (e.g., substrate 102 in FIG. 1A) then being removed, thereby eliminating the substrate 102. For example, FIG. 2 is a stylized cross-sectional view of a typical prior art SOI IC structure 100 for a single FET, fabricated using an SLT process. Essentially, after most or all of the superstructure 112 of FIG. 1A is completed (some layers may be omitted, such as some metallic contacts), a first passivation layer 202 is generally applied on top of the superstructure 112, and then the original substrate 102 and the layers denoted as "X" in FIG. 1A are flipped over and bonded in known fashion to a handling wafer 204, as shown in FIG. 2. Thereafter, the original substrate 102 is removed by mechanical and/or chemical means, exposing the BOX layer 104. A non-conductive second passivation layer 206, which may be a conventional interlayer dielectric (ILD) material, may be formed on the exposed BOX layer 104.

In the structure of FIG. 2, the portions of the FET 108 formerly closest to the original substrate 102 are now found near the top of the IC structure, farthest away from the handling wafer 204. Conversely, those portions of the FET 108 formerly farthest away from the original substrate 102 are now found at the bottom of the IC structure, closest to the handling wafer 204. Thus, the BOX layer 104 in the structure of FIG. 1A was adjacent to the original substrate 102. Although not exactly to scale, the BOX layer 104 in FIG. 1A exhibits relatively high capacitive coupling to the original substrate 102, causing the above-mentioned side effects. Referring to FIG. 2, while the BOX layer 104 is still present with the inverted IC structure, the "back side" of the FET 108 is now near the top of the IC structure with no adjacent semiconductive "gate" material (i.e., the original substrate 102).

While the IC structure of FIG. 2 may be preferred to the closely coupled substrate IC structure of FIG. 1A, where the original substrate 102 serves as a gate for the secondary parasitic back-channel FET 120, the electrical characteristics of the regions of the FET 108 adjacent the BOX layer 104 are still not well controlled.

While SOI FETs have been used in the examples above, similar problems exist in other semiconductor-on-insulator technologies.

Accordingly, there is a need for a FET IC structure that mitigates or eliminates the problems caused by the secondary parasitic back-channel FET 120 of conventional FET IC structures. The present invention addresses this need and more.

SUMMARY

The present invention encompasses semiconductor-on-insulator field effect transistor (FET) integrated circuit (IC) structures and fabrication processes that mitigate or eliminate the problems caused by the secondary parasitic back-channel FET of conventional semiconductor-on-insulator FET IC structures. Embodiments of the current invention enable full control of the secondary parasitic back-channel FET of semiconductor-on-insulator IC primary FETs.

In essence, embodiments of the invention take advantage of the existence of the secondary parasitic back-channel FET of semiconductor-on-insulator IC primary FETs by fabricating such ICs using a process which allows access to the back side of the FET, such as a "single layer transfer" (SLT) process (collectively, a "back-side access process"). Thereafter, a conductive aligned supplemental (CAS) gate structure is fabricated relative to the BOX layer juxtaposed to a primary FET such that a control voltage applied to the CAS gate can regulate the electrical characteristics of the regions of the primary FET adjacent the BOX layer.

A CAS gate is separated from the "back side" of a corresponding primary FET by the BOX layer and/or a protective layer formed as part of the back-side access process. Accordingly, the BOX layer and/or the protective layer function as gate dielectric material for the CAS gate. The CAS gate, the gate dielectric material (i.e., BOX layer and/or the protective layer) between the CAS gate and the body B of the primary FET, and the source S and drain D of the primary FET, forms a controllable MOSFET, with independent control provided by the CAS gate. This is in contrast with—and replaces—the formerly present but uncontrolled secondary parasitic back-channel FET. The IC structures thus present as a four or five terminal device: source S, drain D, primary gate G, CAS gate, and, optionally, a body contact.

By applying control voltages to a CAS gate (typically DC voltages), various effects can be induced in and around the body B of the corresponding primary FET, depending on the type of transistor originally made in the semiconductor-on-insulator structure. For example, FETs that include a CAS gate have a higher voltage capability than conventional FETs due to the ability to bias the CAS gate such that the body B is more depleted than can be accomplished by the primary gate G alone. As another example, FETs that include a CAS gate have a lower ON resistance ($R_{ON}$) than conventional FETs due to the ability to bias the CAS gate such that the body B is more enhanced than can be accomplished by the primary gate G alone, resulting in lower insertion loss as well as a higher current capacity without increasing heat generation. As yet another example, FETs that include a CAS gate may have lower leakage currents in subthreshold operating conditions due to the ability to bias the back-channel region of the body B in a fully OFF condition Notably, all of these benefits are available from the same FET under different operating conditions, just by varying the bias voltage applied to its CAS gate.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 8 is a process flow diagram of a third method for making a transistor device.

Like reference numbers and designations in the various drawings indicate like elements.

DETAILED DESCRIPTION

The present invention encompasses semiconductor-on-insulator field effect transistor (FET) integrated circuit (IC) structures and fabrication processes that mitigate or eliminate the problems caused by the secondary parasitic back-channel FET of conventional semiconductor-on-insulator FET IC structures. Embodiments of the current invention enable full control of the secondary parasitic back-channel FET of semiconductor-on-insulator IC primary FETs.

Overview of Basic Structure

In essence, embodiments of the invention take advantage of the existence of the secondary parasitic back-channel FET of semiconductor-on-insulator IC primary FETs by fabricating such ICs using a process which allows access to the back side of the FET, such as a "single layer transfer" (SLT) process (collectively, a "back-side access process"). Thereafter, a conductive aligned supplemental (CAS) gate structure is fabricated relative to the BOX layer juxtaposed to a primary FET such that a control voltage applied to the CAS gate can regulate the electrical characteristics of the regions of the primary FET adjacent the BOX layer 104.

For simplicity, the following examples of embodiments of the invention utilize silicon-on-insulator (SOI) fabrication technology as one example of semiconductor-on-insulator fabrication techniques. However, it should be understood that the methods, structures, and circuits described below apply generally to other semiconductor-on-insulator fabrication technologies and devices.

Figure 3A:
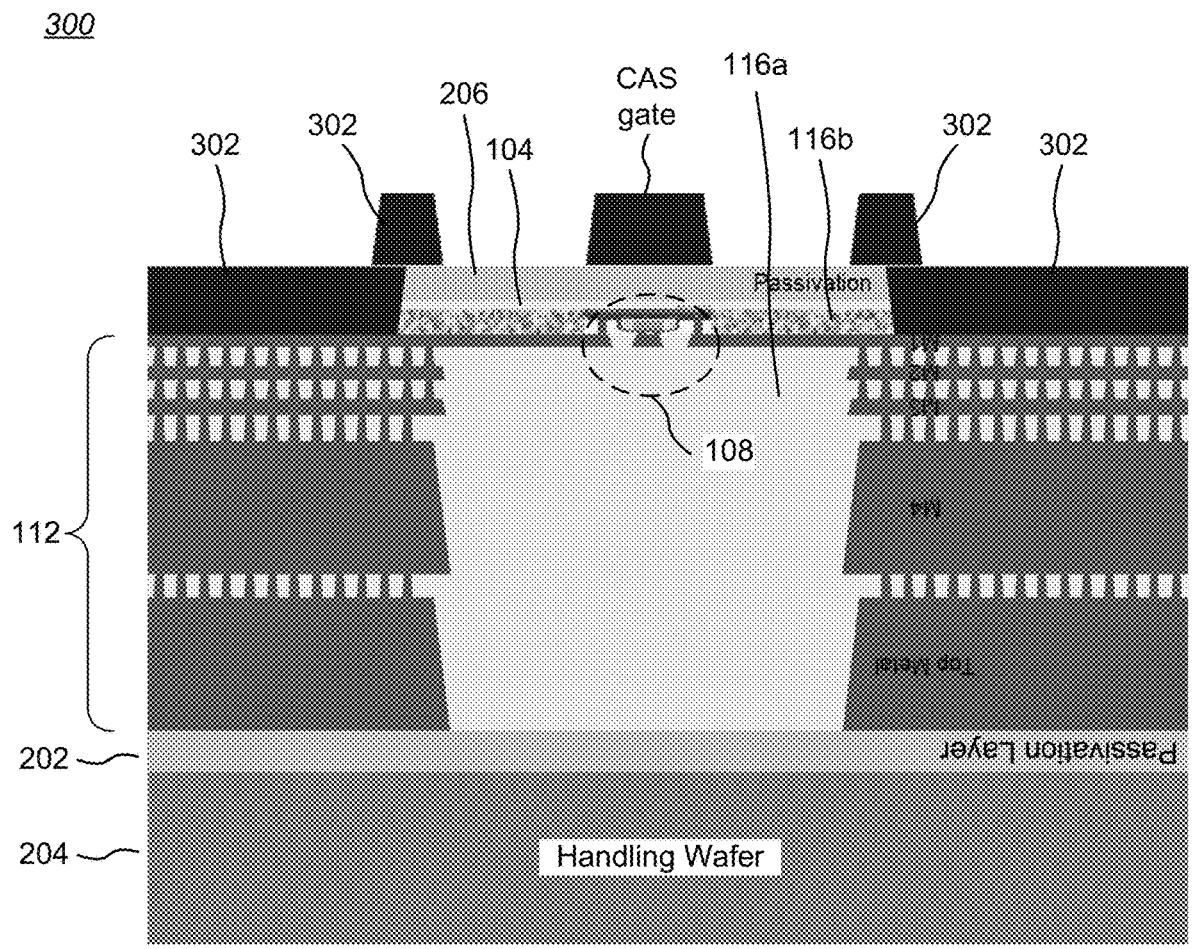
FIG. 3A is a stylized cross-sectional view of an SOI IC structure for a single primary FET 108, showing a conductive aligned supplemental (CAS) gate formed after application of a back-side access process, such as an SLT process.
Figure 3B:
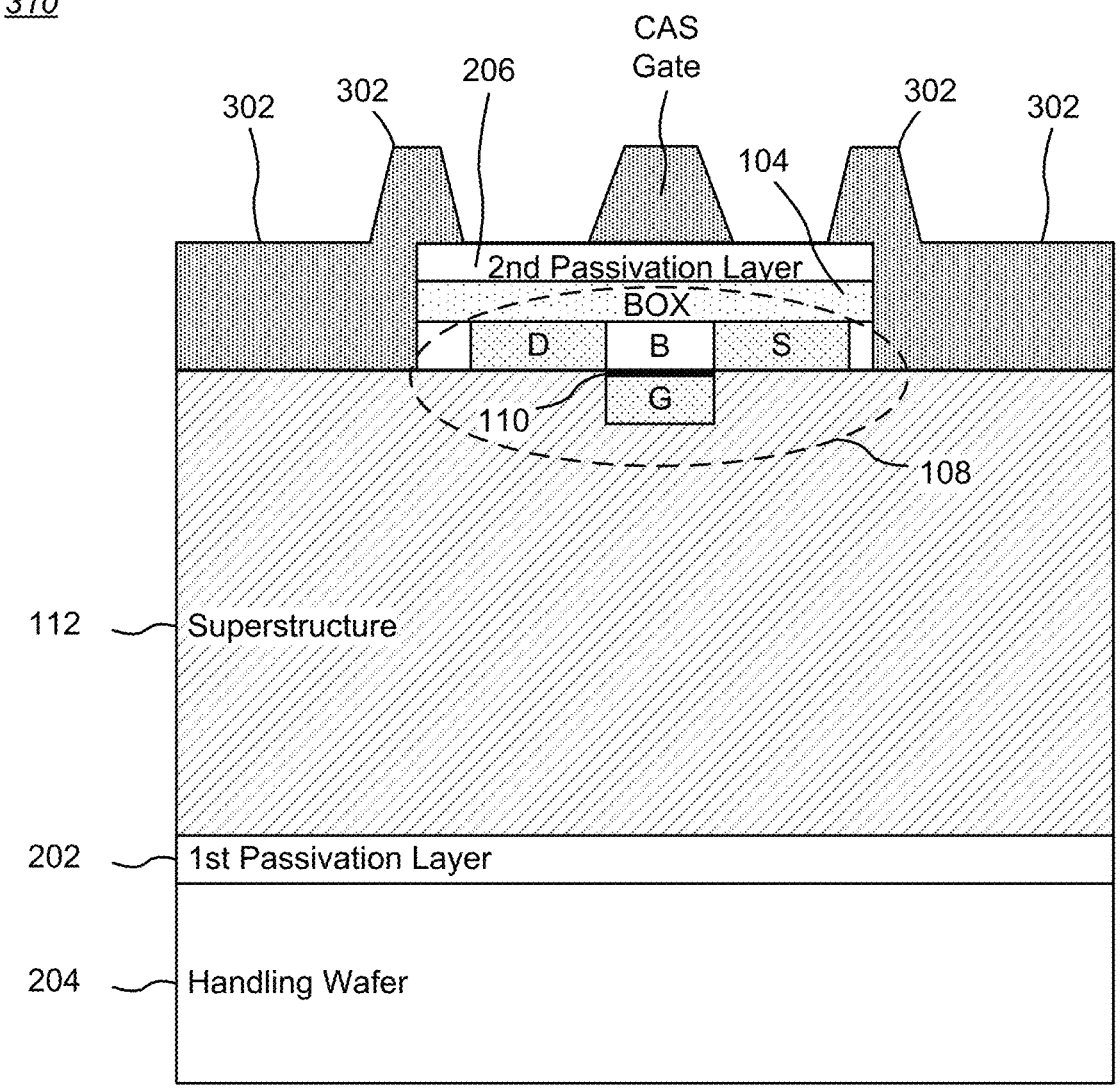
FIG. 3B is a simplified IC structure 310 corresponding to the IC structure of FIG. 3A, redrawn for enhanced clarity of the various structural elements, with the scale of selected elements enlarged relative to other elements for emphasis.

FIG. 3A is a stylized cross-sectional view of an SOI IC structure 300 for a single primary FET 108, showing a conductive aligned supplemental (CAS) gate formed after application of a back-side access process, such as an SLT process. FIG. 3B is a simplified IC structure 310 essentially corresponding to the IC structure 300 of FIG. 3A, redrawn for enhanced clarity of the various structural elements, with the scale of selected elements enlarged relative to other elements for emphasis.

Figure 1A:
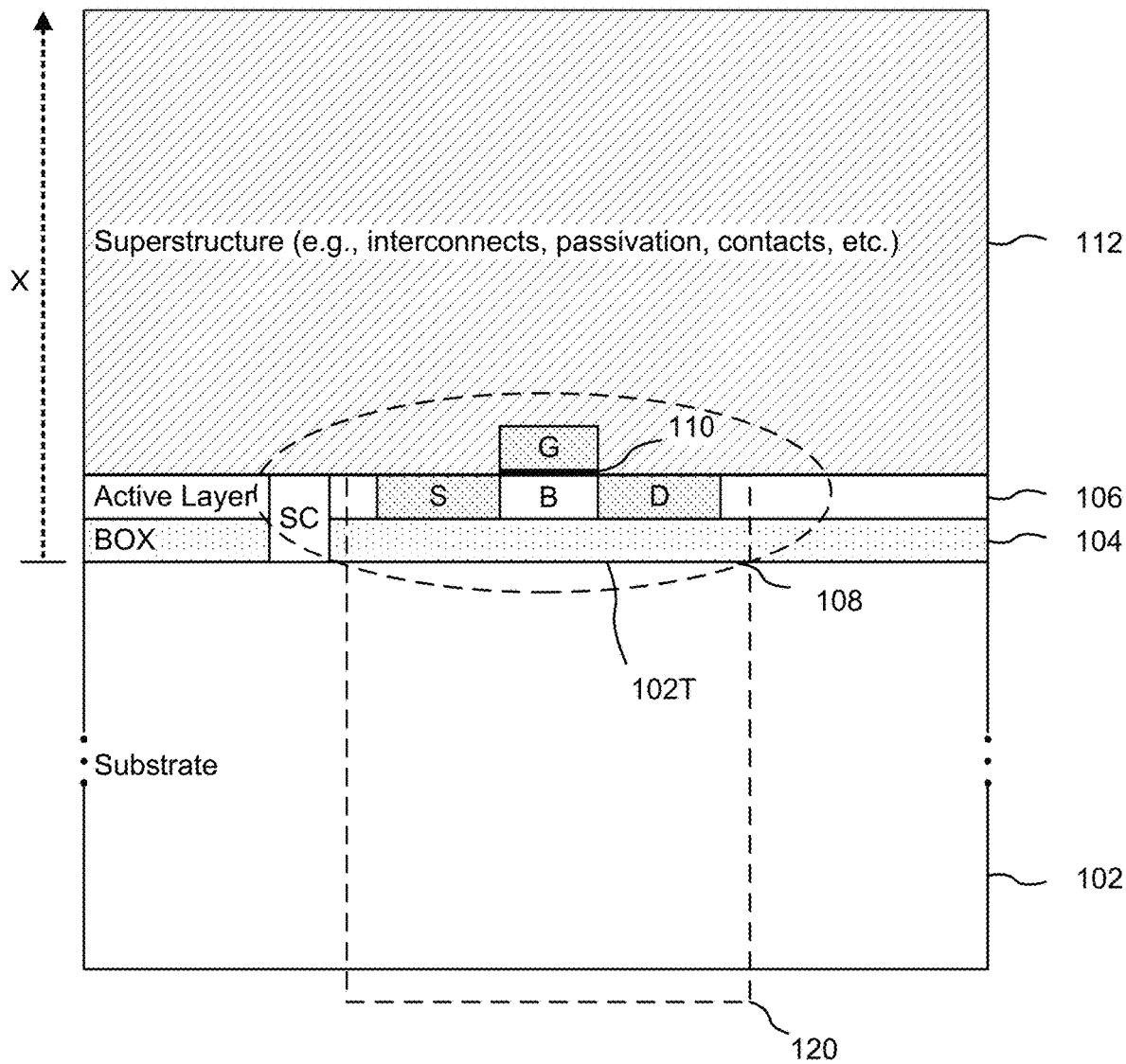
FIG. 1A is a stylized cross-sectional view of a typical prior art SOI IC structure for a single field effect transistor (FET).
Figure 1B:
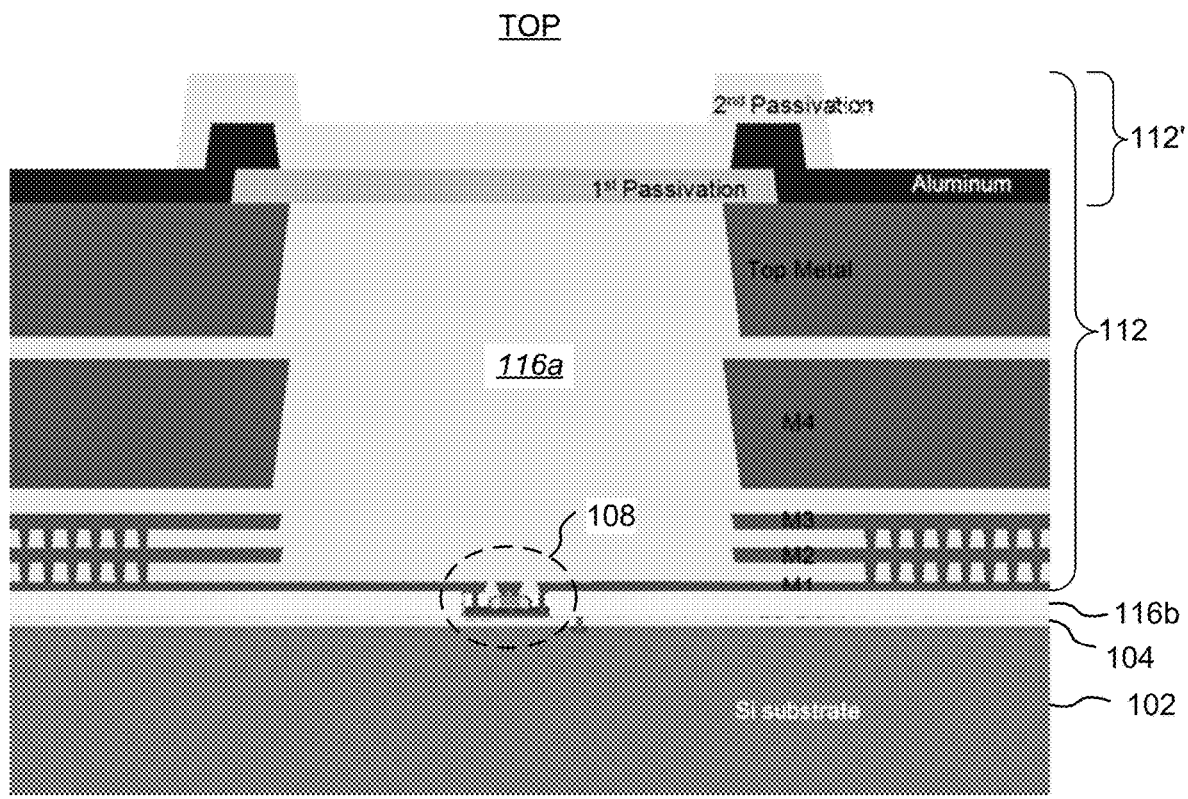
FIG. 1B is a stylized cross-sectional view of a typical prior art SOI IC structure for a single FET, showing details of the superstructure.
Figure 1C:
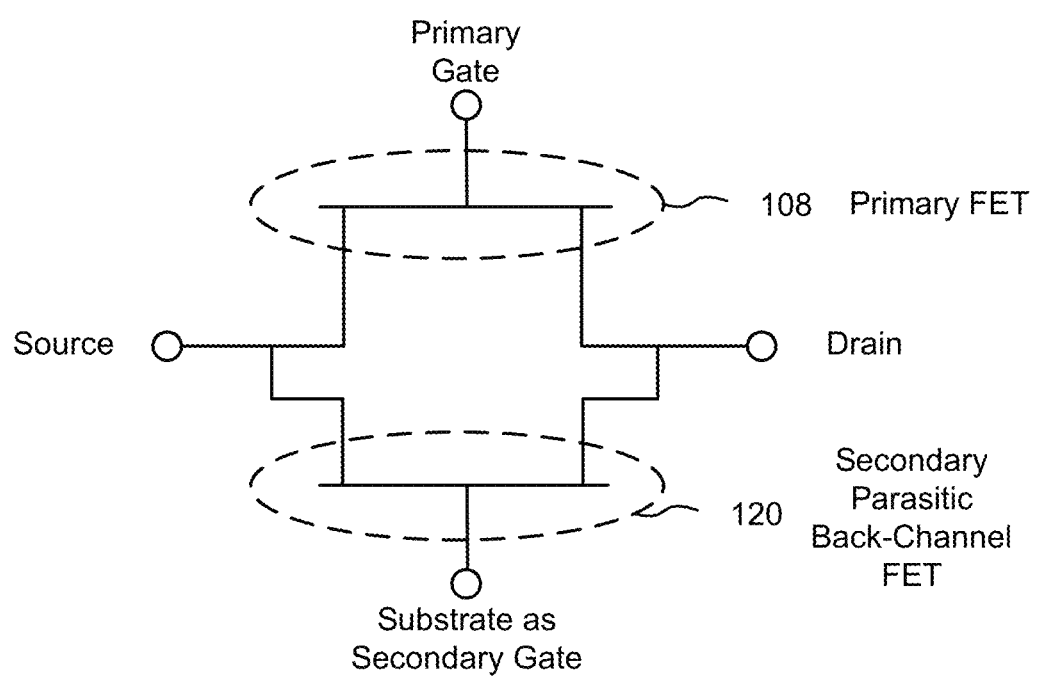
FIG. 1C is an equivalent schematic diagram of the FET structure shown in FIG. 1A, and shows how the secondary parasitic back-channel FET is coupled in parallel with the primary FET.
Figure 2:
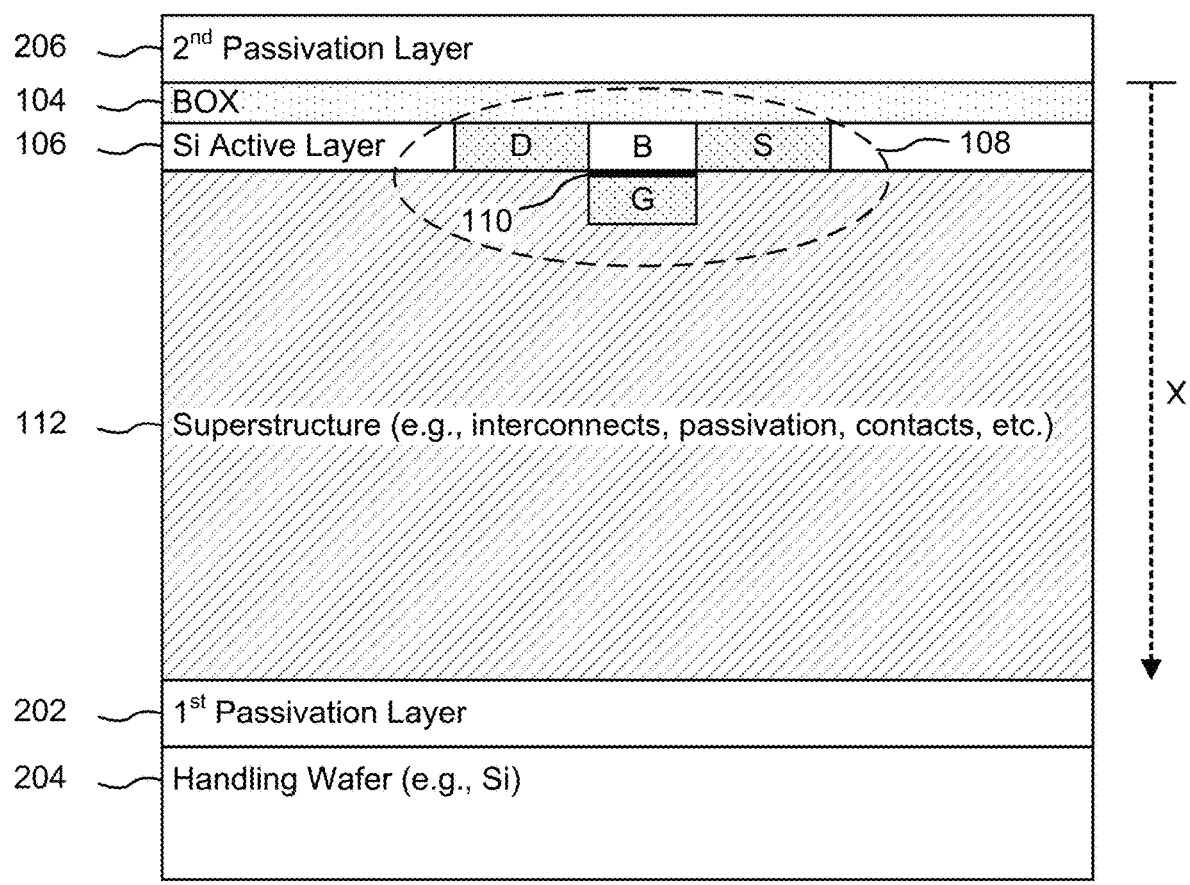
FIG. 2 is a stylized cross-sectional view of a typical prior art SOI IC structure for a single FET, fabricated using an SLT process.

The IC structures 300, 310 are in part similar to the SLT wafer of FIG. 2, except that the second passivation layer 206 of FIG. 2 is modified by the creation of a specially aligned and patterned backside contact pattern (BCP) 302, which may be formed, for example, using redistribution layer (RDL) techniques. The BCP 302 is patterned to define the CAS gate, which is at least partially aligned with a corresponding primary FET 108 adjacent the (former) back-channel of the primary FET 108 and electrically isolated from the rest of the BCP 302. The BCP 302 (and thus the CAS gate) may be formed from aluminum or similar material in the same manner as conventional RDLs are formed on the top-side of the superstructure 112 of non-SLT wafers, such as is shown in FIG. 1B.

A CAS gate defined in the BCP 302 is spaced from the "back side" of the body B of the corresponding primary FET 108 by the BOX layer 104 and/or the second passivation layer 206 formed as part of the SLT process, as described in greater detail below. Accordingly, the BOX layer 104 and/or the second passivation layer 206 function as gate dielectric material for the CAS gate. The CAS gate, the gate dielectric material (i.e., BOX layer 104 and/or the second passivation layer 206) between the CAS gate and the body B of the primary FET 108, and the source S and drain D of the primary FET 108, forms a controllable MOSFET, with independent control provided by the CAS gate. This is in contrast with—and replaces—the formerly present but uncontrolled secondary parasitic back-channel FET 120 shown in FIG. 1A. The IC structures 300, 310 thus generally presents as a five-terminal device: source S, drain D, primary gate G, CAS gate, and a body contact (not shown). Note that there may be circumstances in which a CAS gate may be beneficial, but the body contact may not be needed, and thus such an IC structure would present as a four-terminal device. For example, some digital circuits such as memory cells may use a floating body (i.e., no body contact) for additional drive current, and a CAS gate for lower leakage current.

The relative thickness of the dielectric for the primary gate G is generally much thinner (typically on the order of 2 to 3 orders of magnitude thinner) than the dielectric for the CAS gate. Thus, the CAS gate generally will have a smaller impact on current and threshold voltage in the body B of the primary FET 108 for a particular applied voltage level. However, by applying control voltages to a CAS gate (typically DC voltages), various effects can be induced in and around the body B of the corresponding primary FET 108, depending on the type of transistor originally made in the SOI structure. For example, for a partially depleted SOI primary FET 108, the primary gate G and the CAS gate are isolated by undepleted silicon in the body of the device. Hence, voltages applied to the CAS gate will mostly affect back-channel leakage current, meaning leakage current that cannot be controlled by the primary gate G. Such leakage currents can be large compared to the leakage currents of the main body B under the primary gate G, often because the primary FET is designed to ensure low leakage currents. For digital systems, such leakage currents may be significant to overall system operation. For example, due to the large number of FETs in modern systems, small leakage currents can multiply into large wasted power consumption, especially for battery-operated portable devices. Even in the case of line-powered systems, wasted power and heat load can be substantially affected by leakage currents. Additionally, for RF and analog circuits, very low leakage is key to proper performance. Charged nodes or storage capacitors can be discharged by leakage currents, thereby forcing a recharge cycle that can induce spurious signals ("spurs") in analog circuits that can degrade RF and analog system performance.

For a so-called fully depleted SOI primary FET 108, a voltage applied to the CAS gate will couple capacitively to the primary body B of the primary FET 108, thereby inducing some threshold voltage shift in the primary FET. The impact of leakage current in a fully depleted FET will have the same effects as for a partially depleted FET.

Another benefit of FETs having a CAS gate is that multiple FET devices can be identically fabricated (e.g., same implant doping levels) but controlled by respective CAS control voltages to operate with different threshold voltages, $V_T$. For example, in some applications, it may be useful to have some FETs with a lower $V_T$ while other FETs have a higher $V_T$. This can be achieved by biasing the CAS gates of such FETs with different voltage values, which leads to the otherwise identical FETs exhibiting different threshold voltages $V_T$.

Important benefits of the invention include the following:

- FETs that include a CAS gate have a higher voltage handling capability than conventional FETs (typically exceeding an added 1-2 VDC of voltage handling capability for an SOI NMOS FET with a CAS gate) due to the ability to bias the CAS gate such that the body B is more depleted than can be accomplished by the primary gate G alone; and
- FETs that include a CAS gate have a lower ON resistance, $R_{ON}$, than conventional FETs (typically exceeding about 15% lower for switch FETs and about 30% lower for regular FETs, for SOI NMOS FETs with a CAS gate) due to the ability to bias the CAS gate such that the body B is more enhanced than can be accomplished by the primary gate G alone, resulting in lower insertion loss as well as a higher current capacity without increasing heat generation.
- FETs that include a CAS gate may have lower leakage currents in subthreshold operating conditions due to the ability to bias the back-channel region of the body in a fully OFF condition.
- Data from sample ICs embodying primary FETs with CAS gates show that the presence of a CAS gate does not change the current (Id) versus voltage (Vg) properties of the corresponding primary FET.

Notably, all of these benefits—particularly high voltage handling capability, low $R_{ON}$, and lower leakage currents—are available from the same FET under different operating conditions, just by varying the bias voltage applied to its CAS gate. These characteristics are particularly useful for signal switching applications, and especially RF signal switching circuits and systems.

Example Fabrication Steps

There are a number of ways in which the IC structures 300, 310 of FIGS. 3A and 3B may be fabricated. For an embodiment of the invention utilizing silicon-on-insulator (SOI) fabrication technology, the steps illustrated in FIGS. 4A-4F show one method of fabrication. However, it should be understood that the methods and devices structures described below may be readily adapted to other semiconductor-on-insulator fabrication technologies and devices structures.

Figure 4A:
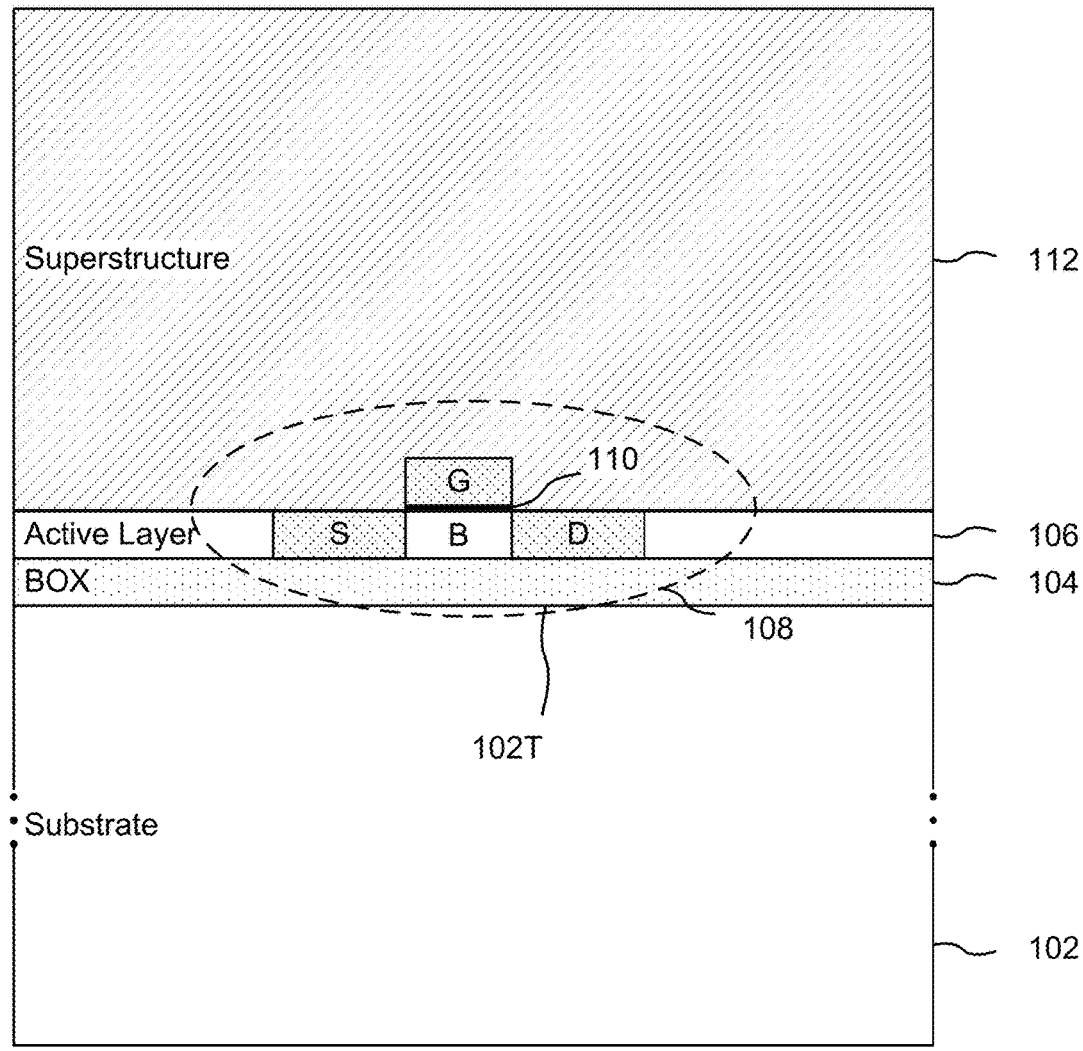
FIG. 4A is a stylized cross-sectional view of a partial SOI IC structure for a single primary FET, showing the results of a conventional fabrication process up to (but generally not including) application of a redistribution layer (RDL) on the top of the IC structure.

FIG. 4A is a stylized cross-sectional view of a partial SOI IC structure 400 for a single primary FET 108, showing the results of a conventional fabrication process up to (but generally not including) application of a redistribution layer (RDL) on the top of the IC structure 400. Thus, the primary FET 108 has been formed within an active layer 106 formed on a BOX layer 104, which in turn has been formed on a substrate 102. Up to this point, the process is essentially the same as the process illustrated in FIG. 1A.

Figure 4B:
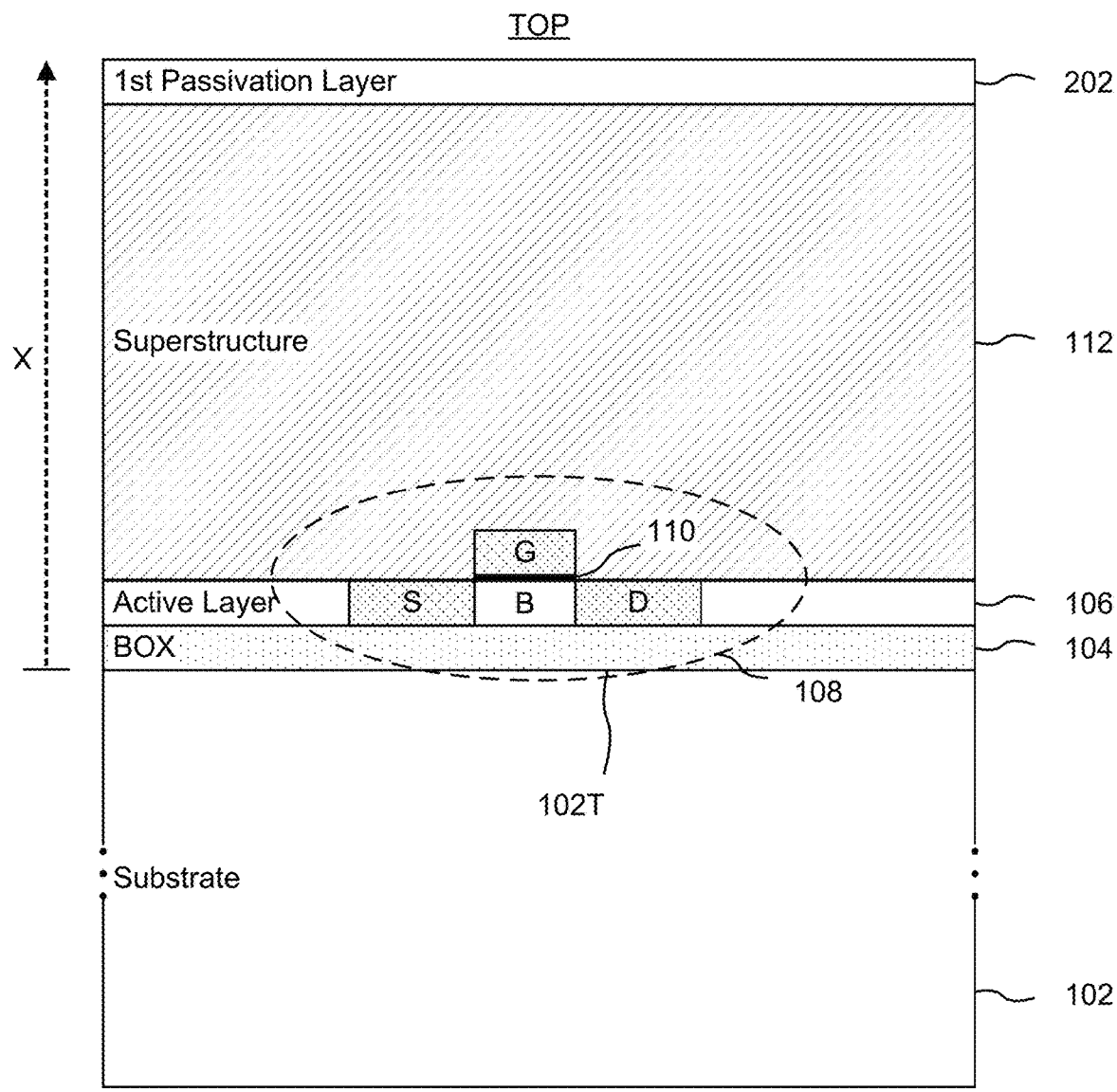
FIG. 4B is a stylized cross-sectional view of a partial SOI IC structure comprising the partial SOI IC structure of FIG. 4A and an added passivation layer formed on the exposed top surface of the superstructure.

FIG. 4B is a stylized cross-sectional view of a partial SOI IC structure 450 comprising the partial SOI IC structure 400 of FIG. 4A and an added first passivation layer 202 formed on the exposed top surface of the superstructure 112. The first passivation layer 202 may be formed in known fashion, such as by deposition of insulating material (e.g., an oxide). The top surface of the first passivation layer 202 is preferably planarized by mechanical or chemical means to facilitate bonding to a handling wafer, in known fashion.

Figure 4C:
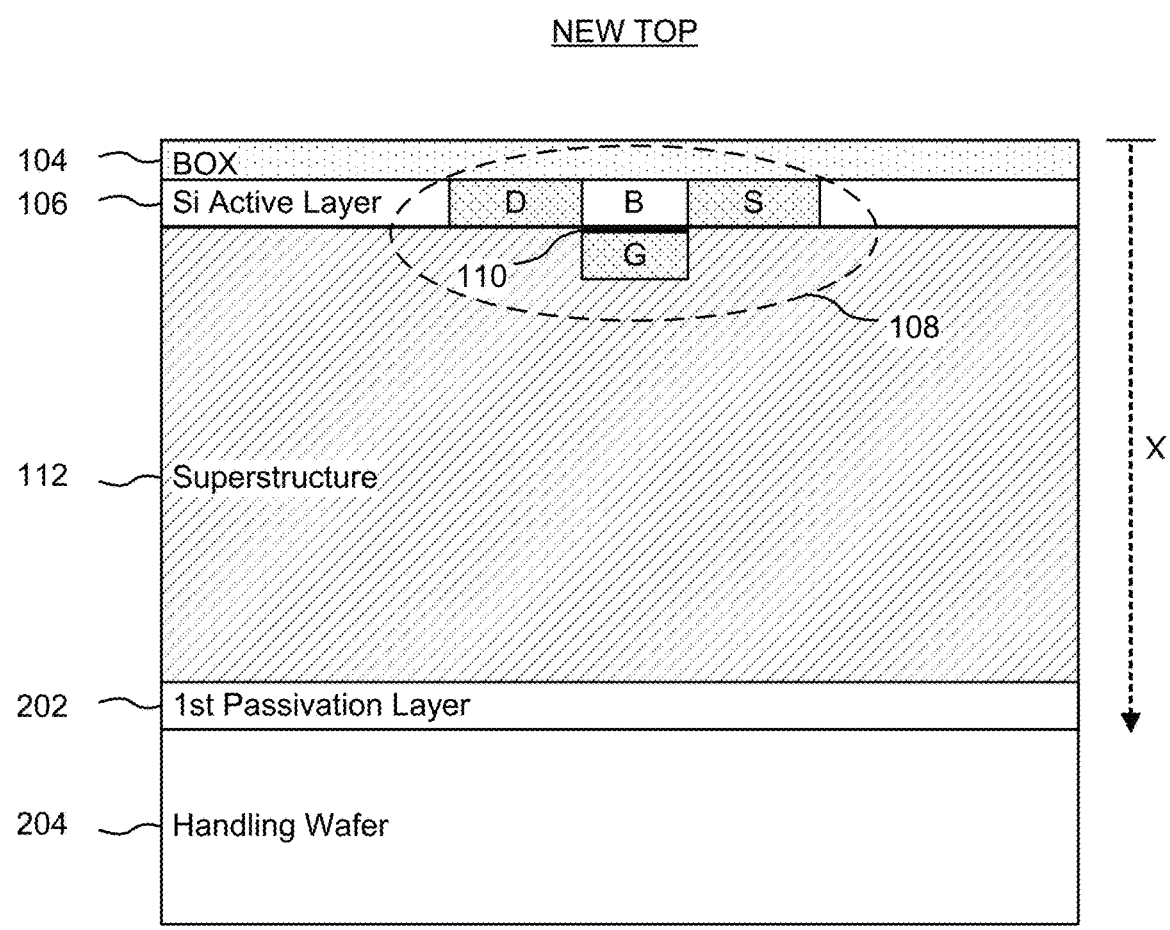
FIG. 4C is a stylized cross-sectional view of a partial SOI IC structure comprising the partial SOI IC structure of FIG. 4B after application of a "single layer transfer" (SLT) process.

FIG. 4C is a stylized cross-sectional view of a partial SOI IC structure 460 comprising the partial SOI IC structure 450 of FIG. 4B after application of a back-side access process, which in this particular example is a "single layer transfer"

(SLT) process. As described above, the SLT process essentially flips an entire SOI transistor structure upside down onto a "handle wafer", with the original substrate (e.g., substrate 102 in FIG. 4B) then being removed, thereby eliminating the substrate 102. Essentially, the original substrate 102 and the layers denoted as "X" in FIG. 4B are flipped over and bonded in known fashion to a handling wafer 204, as shown in FIG. 4C. The handling wafer 204 may be made of glass or other material that is transparent to at least one wavelength of light (including from infrared to x-rays) to facilitate one method of alignment for forming a CAS gate, as described in greater detail below. After bonding the flipped IC structure to the handling wafer 204, the original substrate 102 is removed in known fashion by mechanical and/or chemical means, exposing the BOX layer 104, which is now the "new top" of the IC structure 460.

Figure 4D:
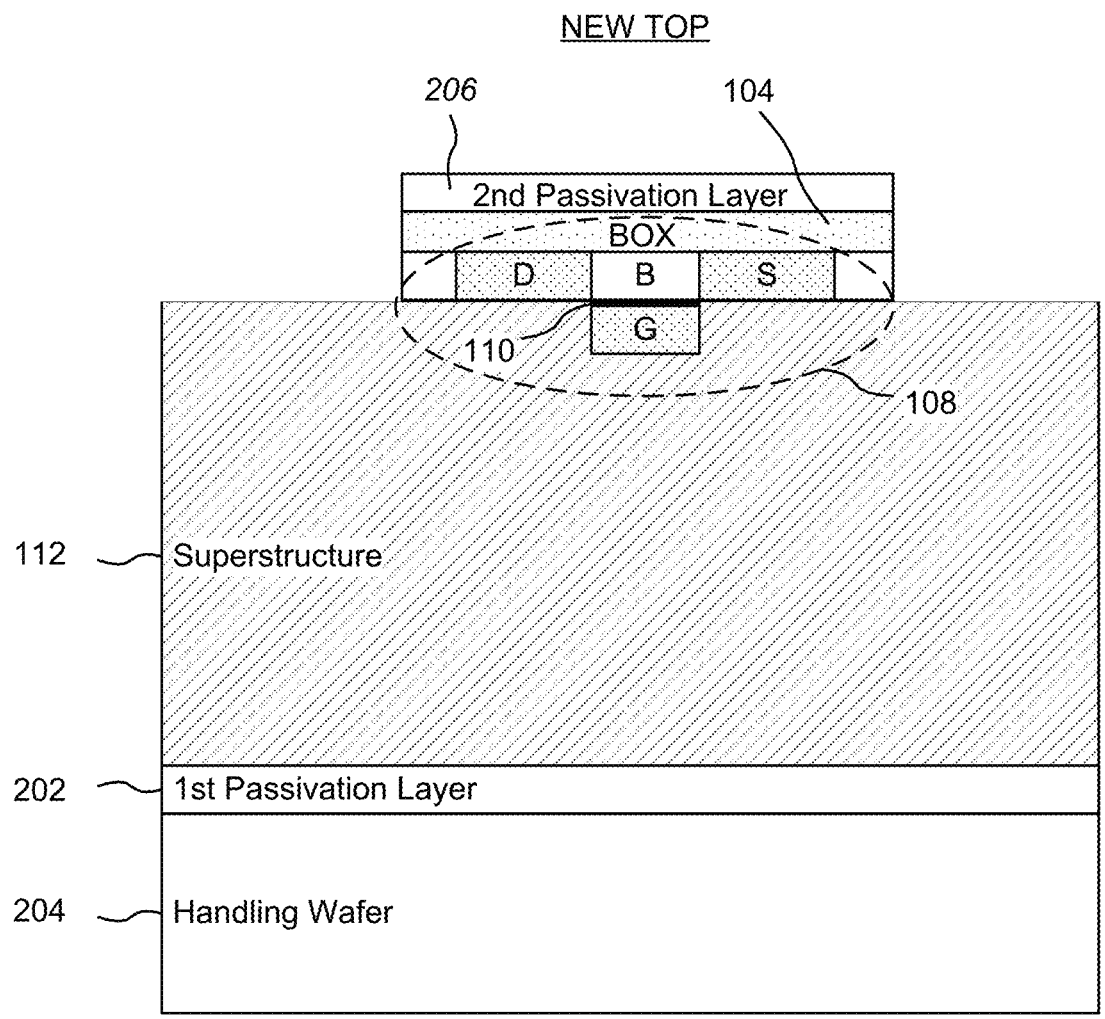
FIG. 4D is a stylized cross-sectional view of a partial SOI IC structure comprising the partial SOI IC structure of FIG. 4C with added structures and modifications.

FIG. 4D is a stylized cross-sectional view of a partial SOI IC structure 470 comprising the partial SOI IC structure 460 of FIG. 4C with added structures and modifications. More particularly, the new top of the IC structure 470 may be covered with a non-conductive second passivation layer 206 using conventional techniques. For example, the second passivation layer 206 may be a conventional interlayer dielectric (ILD) material. The second passivation layer 206 may be patterned to protect one or more selected primary FETs 108, and the new top of the IC structure 470 then etched down to the superstructure 112 surrounding the selected primary FETs 108, such that remaining portions of the second passivation layer 206 and of the BOX layer 104 define locations for those primary FETs. For example, the etching may remove material down to the M1 metal layer of the superstructure 112.

Figure 4E:
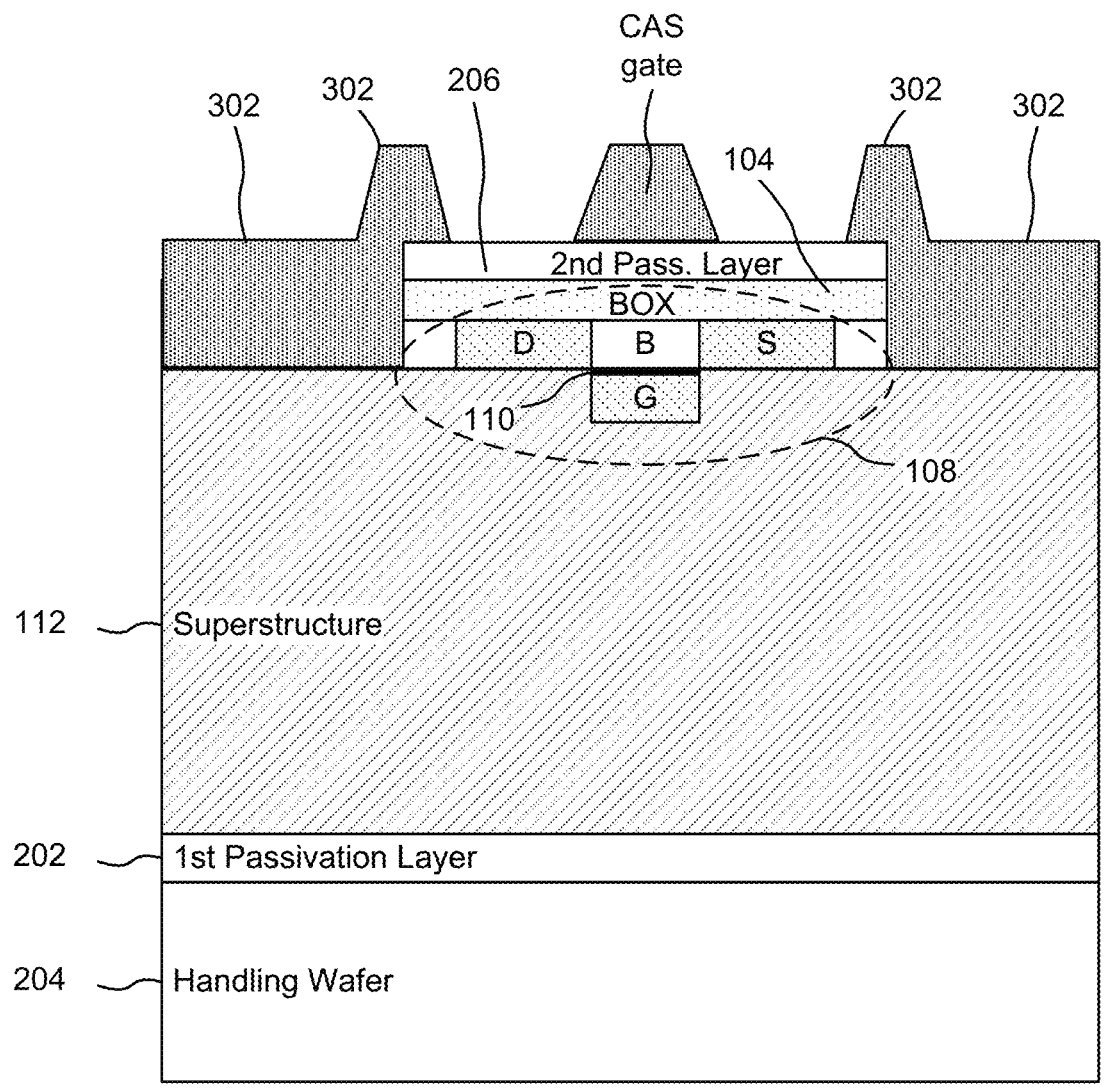
FIG. 4E is a stylized cross-sectional view of a partial SOI IC structure comprising the partial SOI IC structure of FIG. 4D with added structures and modifications.

FIG. 4E is a stylized cross-sectional view of a partial SOI IC structure 480 comprising the partial SOI IC structure 470 of FIG. 4D with added structures and modifications. More particularly, the new top of the IC structure 480 may be covered with a conductive material, such as aluminum or the like, and then patterned and etched, thus forming a backside contact pattern (BCP) 302. The BCP 302 may be formed, for example, using redistribution layer (RDL) techniques, except applied to the exposed "new top" of the IC structure 480. As noted above, the BCP 302 is specifically patterned to define a CAS gate at least partially aligned with a corresponding primary FET 108 and adjacent the (former) back-channel of the primary FET 108. In general, a CAS gate is aligned with the gate G of the primary FET 108. However, in some applications, it may be useful to off-set a CAS gate from substantial alignment with the gate G of the primary FET 108 to change the electrical properties of the device.

Figure 4F:
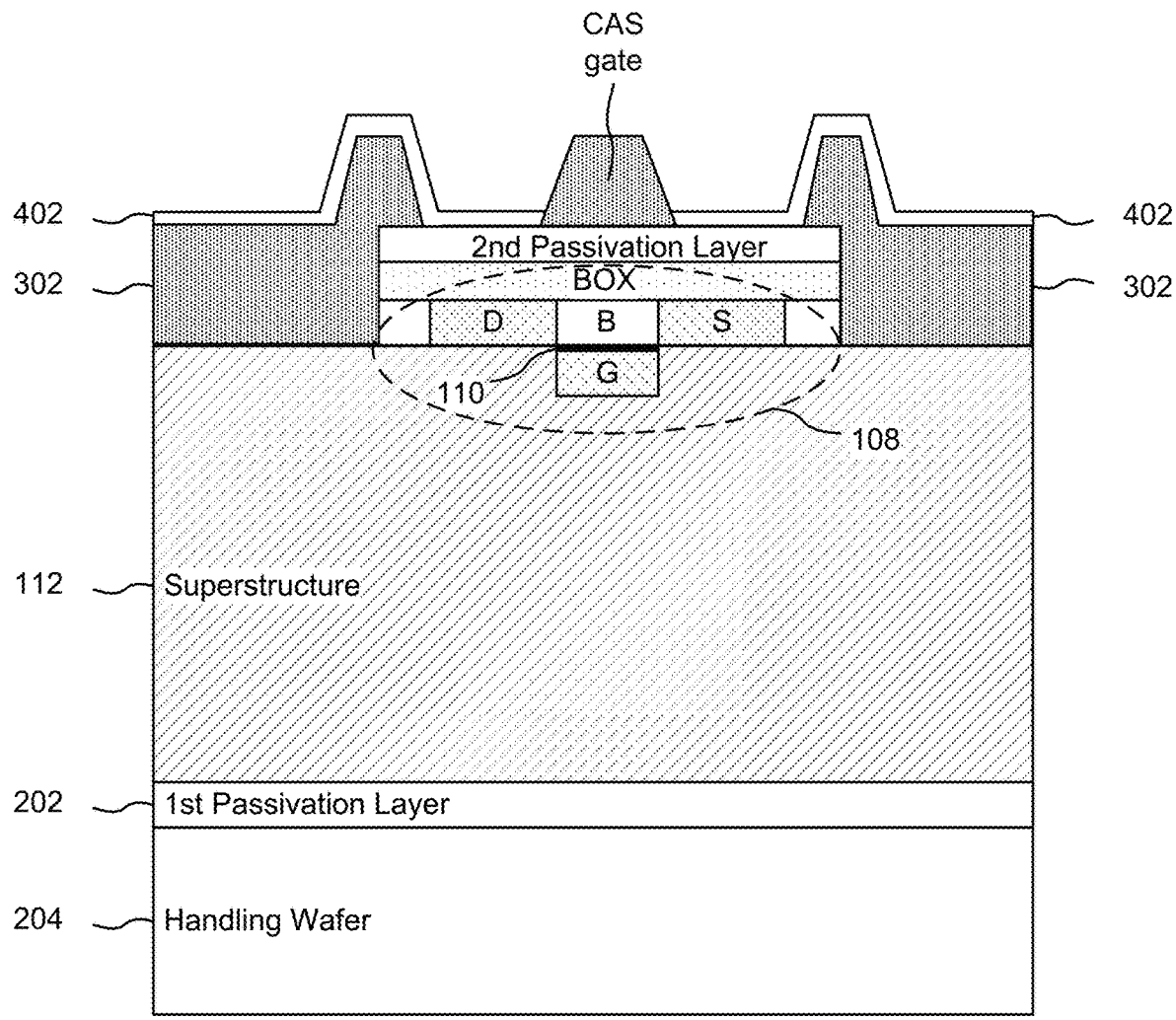
FIG. 4F is a stylized cross-sectional view of a partial SOI IC structure comprising the partial SOI IC structure of FIG. 4E with added structures and modifications.

FIG. 4F is a stylized cross-sectional view of a partial SOI IC structure 490 comprising the partial SOI IC structure 480 of FIG. 4E with added structures and modifications. More particularly, the new top of the IC structure 490 may be patterned and covered in places with a deposited or formed protective or passivation layer 402, which may be, for example, ILD material. As shown in FIG. 4F, the CAS gate is not covered by the protective or passivation layer 402 so as to remain exposed in order to form or attach electrical connections.

Figure 4G:
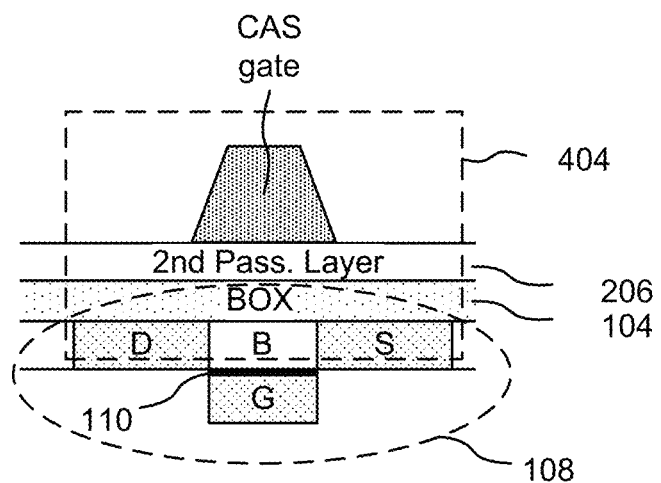
FIG. 4G is a stylized cross-sectional detailed view of the primary FET and CAS gate of FIG. 4F, omitting the other structures shown in FIG. 4F for clarity.

FIG. 4G is a stylized cross-sectional detailed view of the primary FET 108 and CAS gate of FIG. 4F, omitting the other structures shown in FIG. 4F for clarity. The drain D, source S, the CAS gate dielectric material (i.e., BOX layer 104 and/or the passivation layer 206) between the CAS gate and the body B of the primary FET 108, and the CAS gate form a field effect transistor (shown in a dashed square 404).

A primary FET 108 having an added CAS gate may be referred to as a "CAS-gated FET".

As should be apparent to one of ordinary skill in the art, additional layers (not shown) may be formed and patterned on top of the protective or passivation layer 402 in order to connect CAS gates to control voltages and/or to form circuits between the CAS gates and other components.

In addition, the IC structure shown in FIG. 4F, including any added layers (including, for example, planarization layers) may be again "flipped" and bonded to a final substrate, after which the handling wafer 204 would be removed, thus leaving the superstructure 112 in a more accessible orientation for connection to external circuitry and/or IC packaging.

Connections to the source S, drain D, and primary gate G are made in a conventional fashion, and interconnections between a plurality of primary FETs 108 may be made to suit a particular application. CAS-gated FETs may be fabricated as NMOS, PMOS, and/or CMOS transistor devices (comprising NMOS and PMOS devices), and such devices may be full or partial enhancement mode or full or partial depletion mode devices. As noted above, the threshold voltages $V_T$ of the FETs can be varied as a function of the control voltage applied to their respective CAS gates.

As noted above, a single IC die may embody from one primary FET to millions of primary FETs. CAS gates may be fabricated for all or some of such primary FETs to form CAS-gated FETs. Thus, a single IC die may include both conventional primary FETs (i.e., without CAS gates) and one or more CAS-gated FETs. Mixing conventional primary FETs and CAS-gated FETs on an IC die may allow for better circuit control in some applications. Individual CAS gates may also be arranged to bias more than one primary FET.

CAS gates of a particular IC structure may be coupled to a common voltage, such as circuit ground or a non-zero potential. However, since CAS gates can be configured into circuits by adding additional layers on top of the protective or passivation layer 402, particular sets of CAS gate may be coupled to one or more different potentials, and the potentials may be actively controlled by suitable switching and logic circuitry to meet the needs of particular applications.

In summary, one aspect of the invention encompasses a transistor device including a primary field effect transistor (FET) fabricated on a first side of an insulator layer, the primary FET including a source S, a drain D, a gate insulator, and a gate G; and a conductive aligned supplemental (CAS) gate, fabricated in relation to a second, opposite side of the insulator layer and aligned with at least a portion of the primary FET, such that the source S, the drain D, the CAS gate, and at least the insulator layer function as a field effect transistor. In another aspect, the source S, the drain D, and the gate G define a body B, and the gate G is configured to control electrical current flow in a first region within the body B while the CAS gate is configured to control electrical current flow in a second region within the body B. One of ordinary skill will understand that the first region and the second region within the same body may be overlapping (as in the example discussed above of a fully depleted FET).

Alignment

Embodiments of the invention include added steps to form a backside contact pattern (BCP) 302 having defined at least one conductive aligned supplemental (CAS) gate at least partially aligned with a corresponding primary FET 108 and adjacent the (former) back-channel of the primary FET 108. Accordingly, some care should be taken to align the BCP 302, particularly the CAS gates, to the buried structures and regions defining the primary FET 108. As noted above, in general, a CAS gate is aligned with the gate G of the primary FET 108. However, as also noted above, in some applications, it may be useful to off-set a CAS gate from substantial alignment with the gate G of the primary FET 108 to change the electrical properties of the device.

One method for facilitating the task of alignment is making the handling wafer 204 in FIGS. 4C-4F transparent to at least one wavelength of light (including from infrared to x-rays), and forming fiducial marks in or on the superstructure 112 that define the location of a primary FET 108. For example, the handling wafer 204 may be made of glass, which is substantially transparent to at least visible light, or of thin silicon, which is substantially transparent to infrared light. The fiducial marks can then be imaged through the handling wafer 204 using conventional IC fabrication equipment in order to align the masks used for forming the BCP 302, including CAS gates.

Performance Characteristics

Figure 5:
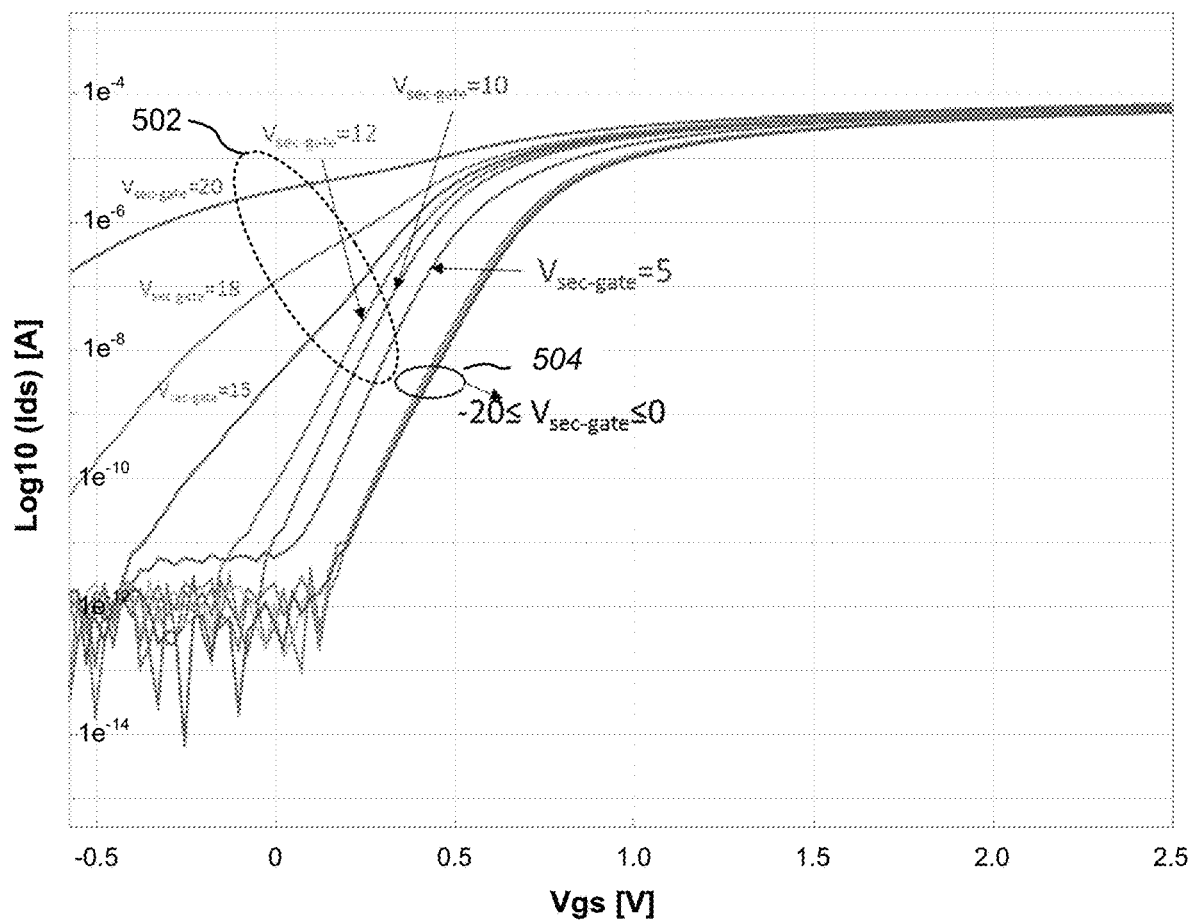
FIG. 5 is a graph of drain-source current (on a log 10 scale) of a CAS-gated FET as a function of primary gate-source voltage, for different values of CAS secondary gate control voltages.

FIG. 5 is a graph of drain-source current (on a log 10 scale) of a CAS-gated FET as a function of primary gate-source voltage, for different values of CAS secondary gate control voltages. The set of graph curves encircled by dotted oval 502 are for positive CAS secondary gate control voltages ("Vsec-gate" values) from 5V to 20V, and show that the leakage current of the FET can be changed as a function of such positive CAS secondary gate control voltages. Conversely, the set of graph curves encircled by solid oval 504 are for non-positive CAS secondary gate control voltages from 0V to −20V, and show that the leakage currents of the FET is fully controlled by such CAS secondary gate control voltages. The effect of negative CAS voltages saturates because once the back-channel is fully turned OFF, it no longer contributes what had been uncontrolled back-channel leakage currents.

Methods

Figure 6:
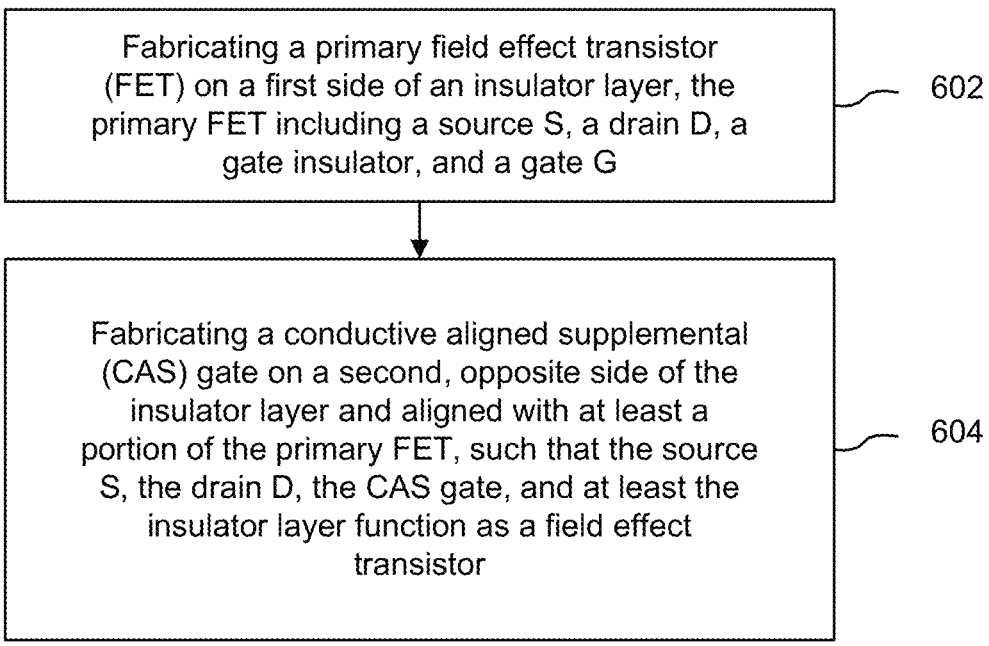
FIG. 6 is a process flow diagram of a first method for making a transistor device.

Another aspect of the invention includes methods for making a transistor device, including transistor devices having a CAS gate structure. For example, FIG. 6 is a process flow diagram of a first method 600 for making a transistor device. In this example, the method 600 includes: fabricating a primary field effect transistor (FET) on a first side of an insulator layer, the primary FET including a source S, a drain D, a gate insulator, and a gate G (STEP 602); and fabricating a conductive aligned supplemental (CAS) gate on a second, opposite side of the insulator layer and aligned with at least a portion of the primary FET, such that the source S, the drain D, the CAS gate, and at least the insulator layer function as a field effect transistor (STEP 604).

Figure 7:
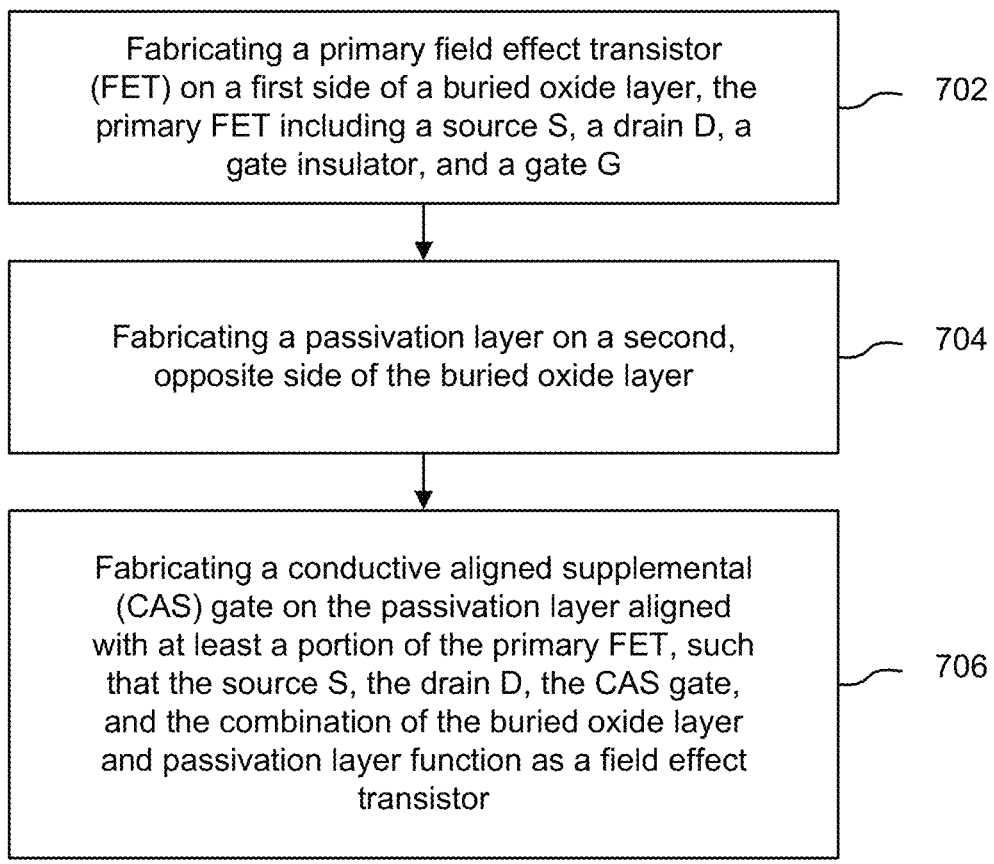
FIG. 7 is a process flow diagram of a second method for making a transistor device.

As another example, FIG. 7 is a process flow diagram of a second method 700 for making a transistor device. In this example, the method 700 includes: fabricating a primary field effect transistor (FET) on a first side of a buried oxide layer, the primary FET including a source S, a drain D, a gate insulator, and a gate G (STEP 702); fabricating a passivation layer on a second, opposite side of the buried oxide layer (STEP 704); and fabricating a conductive aligned supplemental (CAS) gate on the passivation layer aligned with at least a portion of the primary FET, such that the source S, the drain D, the CAS gate, and the combination of the buried oxide layer and passivation layer function as a field effect transistor (STEP 706).

As yet another example, FIG. 8 is a process flow diagram of a third method 800 for making a transistor device. In this example, the method 800 includes: fabricating a partial primary field effect transistor (FET) on a first side of an insulator layer, the insulator layer having a second side in contact with a substrate, the primary FET including a source S, a drain D, a gate insulator, a gate G, and a superstructure formed on a top side of the primary FET (STEP 802); fabricating a first passivation layer on an exposed top surface of the superstructure (STEP 804); applying a back-side access process to remove the substrate and expose the second side of the insulator layer (STEP 806); fabricating a second passivation layer on an exposed second side of the insulator layer (STEP 808); removing selected portions of the second passivation layer and of the insulator layer such that remaining portions of the second passivation layer and of the insulator layer define a location for the primary FET (STEP 810); and fabricating a conductive aligned supplemental (CAS) gate on the second passivation layer and aligned with at least a portion of the primary FET, such that the source S, the drain D, the CAS gate, and at least the insulator layer function as a field effect transistor (STEP 812).

Other aspects of the above methods may include one or more of the following: fabricating the transistor device as an integrated circuit using a semiconductor-on-insulator process; fabricating the transistor device with one of a silicon-on-insulator process or a silicon-on-sapphire process; fabricating a passivation layer interposed between the CAS gate and the insulator layer; wherein the source S, the drain D, and the gate G define a body B, and wherein the gate G is configured to control electrical current flow in a first region within the body B, and the CAS gate is configured to control electrical current flow in a second region within the body B; biasing the CAS gate with a first voltage to lower an ON resistance, $R_{ON}$, of the transistor device; biasing the CAS gate with a second voltage to increase a voltage handling capability of the transistor device; and/or biasing the CAS gate in a first mode of operation with a first voltage to lower an ON resistance, $R_{ON}$, of the transistor device, and in a second mode of operation with a second voltage to increase a voltage handling capability of the transistor device.

Still other aspects of the above methods may include one or more of the following: wherein the source S, the drain D, and the gate G define a body B, wherein the gate G is configured to control electrical current flow in a first region within the body B, and the CAS gate is configured to control electrical current flow in a second region within the body B; biasing the CAS gate with a first voltage to lower an ON resistance, $R_{ON}$, of the transistor device; biasing the CAS gate with a second voltage to increase a voltage handling capability of the transistor device; biasing the CAS gate in a first mode of operation with a first voltage to lower an ON resistance, $R_{ON}$, of the transistor device, and in a second mode of operation with a second voltage to increase a voltage handling capability of the transistor device; and/or wherein fabricating a CAS gate on the second passivation layer includes forming a conductive layer over the second passivation layer, patterning the conductive layer to define at least the CAS gate, and removing at least a portion of the conductive layer to form the defined CAS gate.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures) having characteristics similar to those described above. Integrated circuit embodiments may be fabricated using any suitable substrates and processes, including but not limited to silicon-on-insulator (SOI) and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with a semiconductor-on-insulator-based fabrication process (including SOI, germanium-on-insulator, silicon-on-glass, and SOS), and with fabrication processes having similar characteristics. Fabrication in CMOS with compatible semiconductor-on-insulator processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:
1. A transistor device including:
 (a) a primary field effect transistor (FET) fabricated on a first side of an insulator layer, the primary FET including a source S, a drain D, a gate insulator, and a gate G, wherein the source S, the drain D, and the gate G define a body B, the gate G being physically and electrically configured to be coupled to a first control voltage and being configured to control electrical current flow within the body B;
 (b) a superstructure fabricated with a first side proximate to the FET and a second, opposing side, such that the gate G is situated between the body B and the second, opposing side of the superstructure;
 (c) a handle wafer affixed, directly or through a first passivation layer, to the second, opposing side of the superstructure;
 (d) a conductive aligned supplemental (CAS) gate, fabricated in relation to a second, opposite side of the insulator layer and aligned with at least a portion of the primary FET and with the insulator layer interposed between the CAS gate and the primary FET, such that the source S, the drain D, the CAS gate, and at least the insulator layer function as a second field effect transistor, the CAS gate being physically and electrically configured to be coupled to a second control voltage and being configured to control electrical current flow within the body B such that the second control voltage regulates electrical characteristics in and around the body B of the primary FET; and
 (e) a second passivation layer interposed between the CAS gate and the insulator layer.

2. The invention of claim 1, wherein the transistor device is fabricated as an integrated circuit using a semiconductor-on-insulator process.

3. The invention of claim 1, wherein the transistor device is fabricated with one of a silicon-on-insulator process or a silicon-on-sapphire process.

4. The invention of claim 1, wherein the CAS gate is biased with a selected voltage sufficient to reduce back-channel leakage current in the transistor device.

5. The invention of claim 1, wherein the CAS gate is biased with a first voltage to lower an ON resistance, $R_{ON}$, of the transistor device.

6. The invention of claim 1, wherein the CAS gate is biased with a second voltage to increase a voltage handling capability of the transistor device.

7. The invention of claim 1, wherein the CAS gate is biased in a first mode of operation with a first voltage to lower an ON resistance, $R_{ON}$, of the transistor device, and is biased in a second mode of operation with a second voltage to increase a voltage handling capability of the transistor device.

8. A transistor device fabricated with a silicon-on-insulator process, the transistor device including:
 (a) a primary field effect transistor (FET) fabricated on a first side of a buried oxide layer, the primary FET including a source S, a drain D, a gate insulator, and a gate G, wherein the source S, the drain D, and the gate G define a body B, the gate G being physically and electrically configured to be coupled to a first control voltage and being configured to control electrical current flow within the body B;
 (b) a superstructure fabricated with a first side proximate to the FET and a second, opposing side, such that the gate G is situated between the body B and the second, opposing side of the superstructure;

(c) a handle wafer affixed, directly or through a first passivation layer, to the second, opposing side of the superstructure;

(d) a second passivation layer formed on a second, opposite side of the buried oxide layer; and (e) a conductive aligned supplemental (CAS) gate, fabricated on the second passivation layer aligned with at least a portion of the primary FET, such that the source S, the drain D, the CAS gate, and the combination of the buried oxide layer and second passivation layer function as a second field effect transistor, the CAS gate being physically and electrically configured to be coupled to a second control voltage and being configured to control electrical current flow within the body B such that the second control voltage regulates electrical characteristics in and around the body B of the primary FET.

9. The invention of claim 8, wherein the CAS gate is biased with a selected voltage sufficient to reduce back-channel leakage current in the transistor device.

10. The invention of claim 8, wherein the CAS gate is biased with a first voltage to lower an ON resistance, $R_{ON}$, of the transistor device.

11. The invention of claim 8, wherein the CAS gate is biased with a second voltage to increase a voltage handling capability of the transistor device.

12. The invention of claim 8, wherein the CAS gate is biased in a first mode of operation with a first voltage to lower an ON resistance, $R_{ON}$, of the transistor device, and is biased in a second mode of operation with a second voltage to increase a voltage handling capability of the transistor device.

13. A method for making a transistor device, including:

(a) fabricating a primary field effect transistor (FET) on a first side of an insulator layer, the primary FET including a source S, a drain D, a gate insulator, and a gate G, wherein the source S, the drain D, and the gate G define a body B, the gate G being physically and electrically configured to be coupled to a first control voltage and being configured to control electrical current flow within the body B;

(b) fabricating a superstructure with a first side proximate to the FET and a second, opposing side, such that the gate G is situated between the body B and the second, opposing side of the superstructure;

(c) affixing a handle wafer, directly or through a first passivation layer, to the second, opposing side of the superstructure;

(d) fabricating a conductive aligned supplemental (CAS) gate on a second, opposite side of the insulator layer and aligned with at least a portion of the primary FET, such that the source S, the drain D, the CAS gate, and at least the insulator layer function as a field effect transistor;

(e) configuring the CAS gate to be physically and electrically coupled to a second control voltage to control electrical current flow within the body B such that the second control voltage regulates electrical characteristics in and around the body B of the primary FET and (e) fabricating a second passivation layer interposed between the CAS gate and the insulator layer.

14. The method of claim 13, further including fabricating the transistor device as an integrated circuit using a semiconductor-on-insulator process.

15. The method of claim 13, further including fabricating the transistor device with one of a silicon-on-insulator process or a silicon-on-sapphire process.

16. The method of claim 13, further including biasing the CAS gate with a selected voltage sufficient to reduce back-channel leakage current in the transistor device.

17. The method of claim 13, further including biasing the CAS gate with a first voltage to lower an ON resistance, $R_{ON}$, of the transistor device.

18. The method of claim 13, further including biasing the CAS gate with a second voltage to increase a voltage handling capability of the transistor device.

* * * * *